(12) United States Patent
Couch

(10) Patent No.: US 6,792,018 B2
(45) Date of Patent: Sep. 14, 2004

(54) METHODS AND APPARATUSES FOR MEASURING AND CONTROLLING A LASER OUTPUT IN A PASSIVE OPTICAL NETWORK

(75) Inventor: Phil Couch, Honiton (GB)

(73) Assignee: Carrier Access Corporation, Boulder, CO (US)

( * ) Notice: Subject to any disclaimer, the term of this patent is extended or adjusted under 35 U.S.C. 154(b) by 0 days.

(21) Appl. No.: 10/192,020

(22) Filed: Jul. 10, 2002

(65) Prior Publication Data

US 2003/0219050 A1 Nov. 27, 2003

Related U.S. Application Data

(62) Division of application No. 10/191,999, filed on Jul. 9, 2002.
(60) Provisional application No. 60/382,506, filed on May 21, 2002.

(51) Int. Cl.[7] .................................................. H01L 3/00
(52) U.S. Cl. ............................... 372/38.02; 372/38.09; 250/208.1
(58) Field of Search ......................... 372/26, 31, 38.02, 372/38.09, 38.07; 359/110, 119, 125, 136; 369/116; 324/247; 398/195; 250/208.1; 345/157; 257/440

(56) References Cited

U.S. PATENT DOCUMENTS

| | | | | |
|---|---|---|---|---|
| 4,101,847 A | * | 7/1978 | Albanese | 372/31 |
| 4,789,987 A | * | 12/1988 | Fraser | 372/31 |
| 5,153,764 A | * | 10/1992 | Faulkner et al. | 359/136 |
| 5,216,659 A | * | 6/1993 | Call et al. | 369/116 |
| 5,287,366 A | * | 2/1994 | Epworth et al. | 372/26 |
| 5,309,461 A | * | 5/1994 | Call et al. | 372/38.09 |
| 5,479,424 A | * | 12/1995 | Sakuyama | 372/26 |
| 5,526,164 A | * | 6/1996 | Link et al. | 398/195 |
| 5,563,898 A | * | 10/1996 | Ikeuchi et al. | 372/38.07 |
| 5,623,355 A | * | 4/1997 | Olsen | 359/110 |
| 6,097,746 A | * | 8/2000 | Noda et al. | 372/38.09 |
| 6,219,084 B1 | * | 4/2001 | Van Uffel et al. | 347/247 |
| 6,512,385 B1 | * | 1/2003 | Pfaff et al. | 324/753 |
| 6,529,300 B1 | * | 3/2003 | Milton et al. | 359/119 |
| 2002/0063924 A1 | * | 5/2002 | Kimbrough et al. | 359/125 |

OTHER PUBLICATIONS

RD 338016 A, Jun. 1992, Derwent.*

* cited by examiner

*Primary Examiner*—Hoanganh Le
*Assistant Examiner*—Jimmy T. Vu
(74) *Attorney, Agent, or Firm*—Holland & Hart LLP (57) ABSTRACT

The present invention provides apparatuses and methods for measurement and control of a laser in a passive optical network. In particular, prior to receiving a transmission grant, the laser is pre-driven at a current below a predetermined threshold to "pre-charge" the laser. Also, during the zero level measurement interval, the laser is driven at a non-zero level and the required zero level current is calculated.

21 Claims, 11 Drawing Sheets

METHODS AND APPARATUSES FOR MEASURING AND CONTROLLING A LASER OUTPUT IN A PASSIVE OPTICAL NETWORK

RELATED APPLICATIONS

This application claims the benefit of U.S. patent application Ser. No. 60/382,506, filed May 21, 2002, titled METHODS AND APPARATUSES FOR OPTICAL NETWORK TERMINATION AND MEDIA ACCESS CONTROL IN A PASSIVE OPTICAL NETWORK. This application is a divisional application of U.S. patent application No. 10/191,999 titled METHODS AND APPARATUSES FOR DIRECT DIGITAL DRIVE OF A LASER IN A PASSIVE OPTICAL NETWORK, filed Jul. 9, 2002, incorporated herein by reference.

FIELD OF THE INVENTION

The present invention relates to an optical network and, more particularly, a hardware implementation of the APON protocols, a direct digital drive of a laser diode, and measurement and control system for the direct digital drive of the laser diode.

BACKGROUND OF THE INVENTION

A passive optical network (PON) is an optical network that distributes signals to multiple terminal devices using passive splitters without active electronics, such as, for example, repeaters. Conventionally, signal delivery over passive networks uses a variety of transfer protocols, such as, for example, a synchronous optical network (SONET) or an asynchronous transfer mode (ATM) protocols. From time to time, the International Telecommunication Union (ITU) issues recommendations and standards for PONs under standard G.983.1, which standard is incorporated herein by reference. Generally, the present invention is described with relation to APON, asynchronous transfer mode passive optical networks and the associated protocols, but one of ordinary skill in the art would understand that the use of APON is illustrative of the present invention and the present invention could be used for other types of passive optical networks, for example, EPON.

Figure 1:
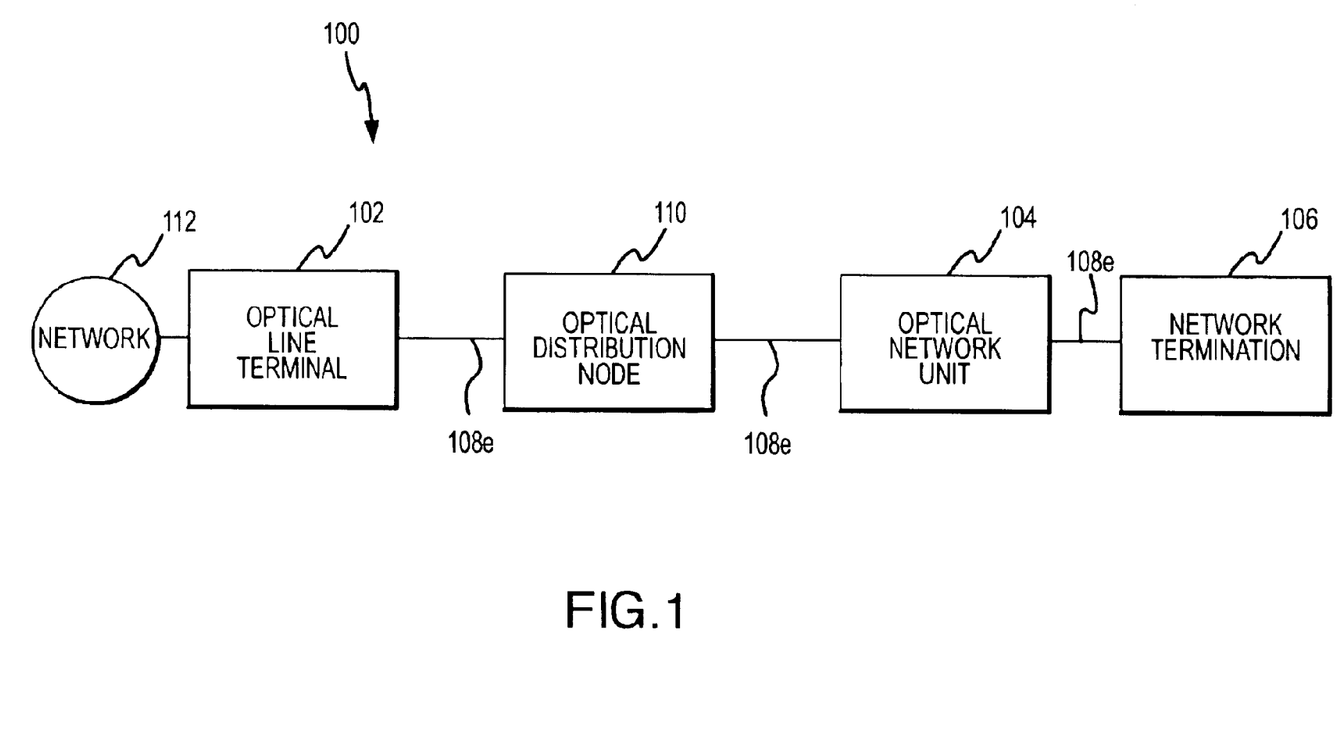
FIG. 1 is functional block diagram of a conventional passive optical network.

FIG. 1 illustrates a conventional APON 100. APON 100 could be either a fiber to the building (FTTB) or a fiber to the home (FTTH) network configuration. Generally, the PON system comprises an optical line terminal (OLT) 102, at least one optical network unit (ONU) 104, and at least one network termination (NT) 106 where an end user can access the system using, for example, a conventional computer, processor, or the like (not specifically shown). Connections 108o from the OLT 102 to the ONU 104 are fiber or optical connections and connections 108e from the ONU 104 to the NTs 106 are electrical connections. Depending on the number of ONUs 104 and NTs 106, one or more optical distribution nodes (ODN, a.k.a optical splitters and combiners) 110 may be situated between OLT 102 and ONU 104. Generally, ONUs 104 and NTs 106 reside at the end user or subscriber location (not specifically shown).

Figure 9:
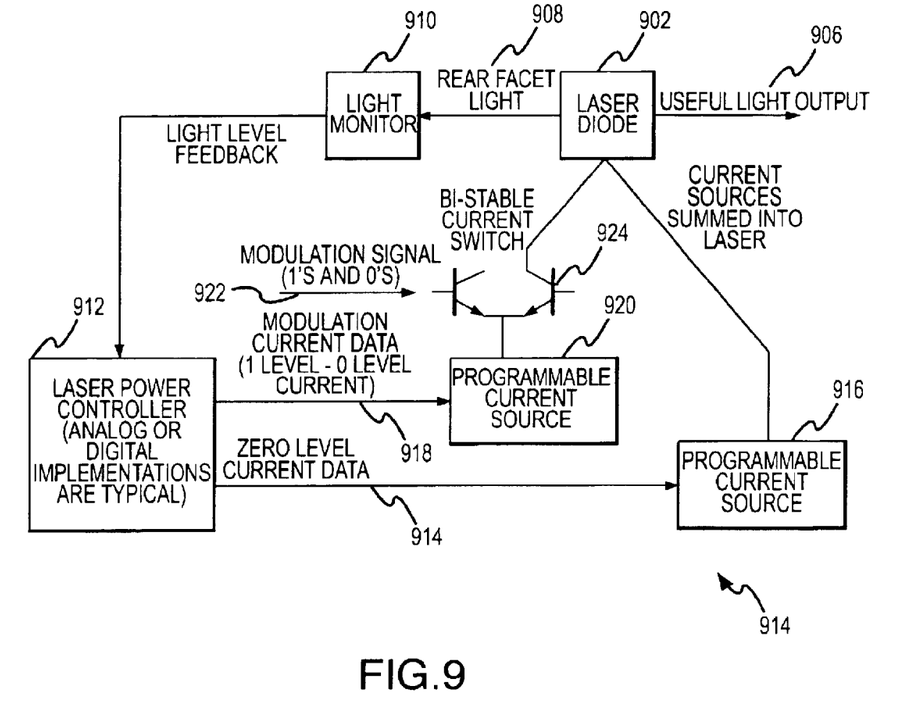
FIG. 9 is a functional block diagram of a prior art laser diode power supply.

FIG. 9 illustrates a laser diode 902 using a conventional power source control system 904. As shown, laser diode 902 emits useful light 906 and rear facet light 908. Useful light 906 refers to light transmitted to connection 108O. A light monitor 910, which could be a photodiode, a light meter, or the like, senses the intensity of rear facet light 908. The intensity of rear facet light 908 corresponds to the intensity of useful light 906. Substantially simultaneously with sensing the intensity of rear facet light, light monitor 910 supplies a light level feedback signal to a laser power controller 912. Laser power controller 912 supplies a zero level current data signal 914 to a first programmable current source 916. First programmable current source 916 supplies the current necessary to drive laser diode 902 at the light intensity that corresponds to a logic level zero. Laser power controller 912 also supplies a modulation current data signal 918 to a second programmable current source 920. The modulation current data signal 918 determines the light intensity of the useful light output 906. A modulation signal 922 is supplied to the gate of a bi-stable switch 924 to turn the switch on and off based on whether the useful light intensity 906 should be at the logic 1 or the logic 0 intensity. The bi-stable switch passes current from the programmable current source 920 to be summed with the current from programmable source 916. The sum of the two currents drives laser diode 902. The feedback signal to laser power controller 912 allows fine-tuning of the drive currents so the average intensity of the light signal remains within the protocol requirements for logic levels 1 and 0. These current vary widely from laser diode to laser diode ranging from as low as 2 or 3 milliamps to as high as 50 to 60 milliamps.

Figure 10:
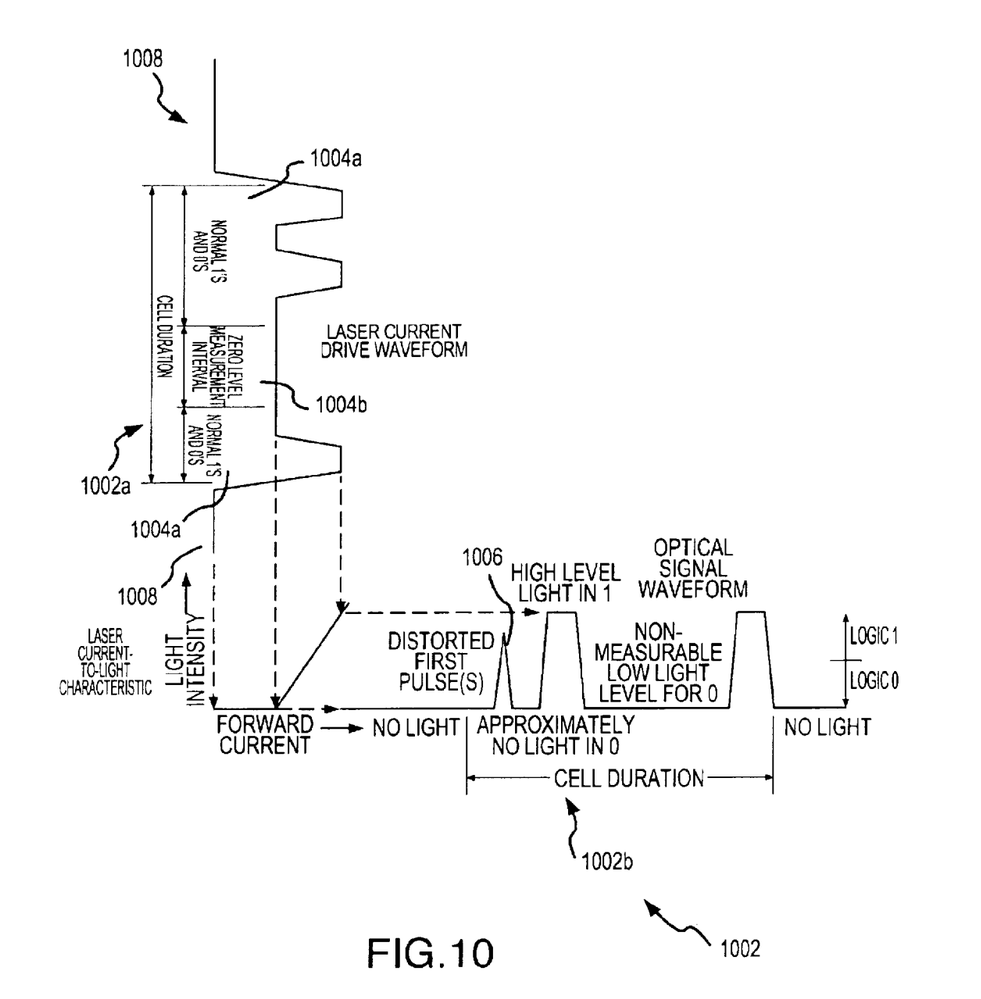
FIG. 10 is a graphical representation of prior art laser current to light characteristics.

FIG. 10 is a diagrammatic representation of useful light intensity to drive current. In particular, FIG. 10 shows transmission of an information cell 1002. As is known in the art, cell 1002 is an ATM protocol for transmitting information. FIG. 10 (and FIG. 11) does not actually represent transmission of a complete cell of information, but rather a short burst of information for convenience. Cell 1002a represents drive current for exemplary cell 1002 and cell 1002b represents light intensity for exemplary cell 1002. As shown, cell 1002a can be considered in discrete parts 1004a and 1004b. Part 1004a is the drive current necessary for the transmission of light bearing information having an intensity of logic 1s and 0s. Part 1004b is the drive current for the transmission of light having an intensity of logic 0 to allow for a zero level measurement only; in other words, no information is being transmitted during the zero level measurement. The duration and timing of part 1004b is generally controlled by the associated transmission protocols. Similarly, light intensity shown by cell 1002b over the course of cell 1002 transitions between the high and low drive currents for the laser diode. As the diagram shows, because of difficulties in controlling the drive current for the laser diode, first logic pulse 1006 is typically wasted adjusting the drive current for the existing operating conditions and temperatures. Part of the difficulty of controlling current occurs because the lasing cavity needs to charge the photons sufficiently to begin emitting light. Also, when the photons in the lasing cavity are sufficiently charged to the threshold or knee level, the laser emits a burst of light and oscillates until the photons are properly charged and the laser is correctly operating above the threshold level.

As can be seen from FIG. 10, during non-transmission period 1008, laser diode 902 is driven at a 0 current. Laser diode 902 is driven with a 0 current to inhibit the accidental transmission of light from laser diode 902 when laser diode 902 does not have a transmission grant. The drive current for a logic level 0 light intensity is some current greater than 0 current. Thus, one reason the first logic pulse 1006 is wasted is that time during the transmission of cell 1002 is required to charge the photons in the laser. While maintaining the laser drive current at the zero logic drive current (which is greater than 0 amps) would maintain the laser charged, it might allow for inadvertent light emission from the laser, which would cause interference with other transmitting lasers.

Figure 2:
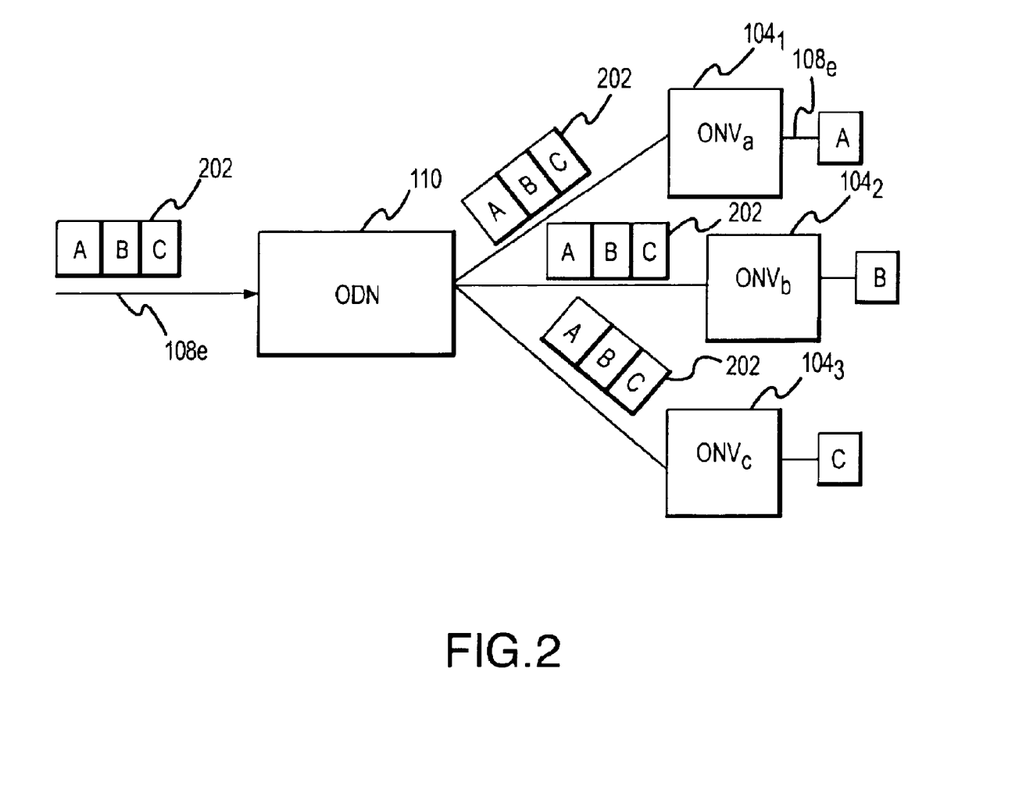
FIG. 2 is a functional block diagram of a conventional passive optical network transmitting information from the transport network to the network terminations.

Transmission of a cell of information will be further explained with reference to FIGS. 1–3. Using ATM protocols, OLT 102 receives incoming cells 202 of information from a transport network or service node 112 destined for NTs 106. For simplicity, this example has three cells of information ABC destined for three separate NTs 106. The transport network could be any style network, such as the Internet, a Plain Old Telephone Service (POTS), digital video and/or audio streams. OLT 102 routes the incoming cell 202 over optical connection 108o through ODN 110 to three ONUs 104$_{1-3}$. Using conventional protocols associated with APON, ONU 104$_{1-3}$ selects the data for its associated NT 106 and converts the optical signal to an electrical signal for distribution to the NT 106 over connection 108e. For example, ONU$_a$ selects data cell A from incoming cell 202 and converts that data into an electrical signal for NT 106.

Figure 3:
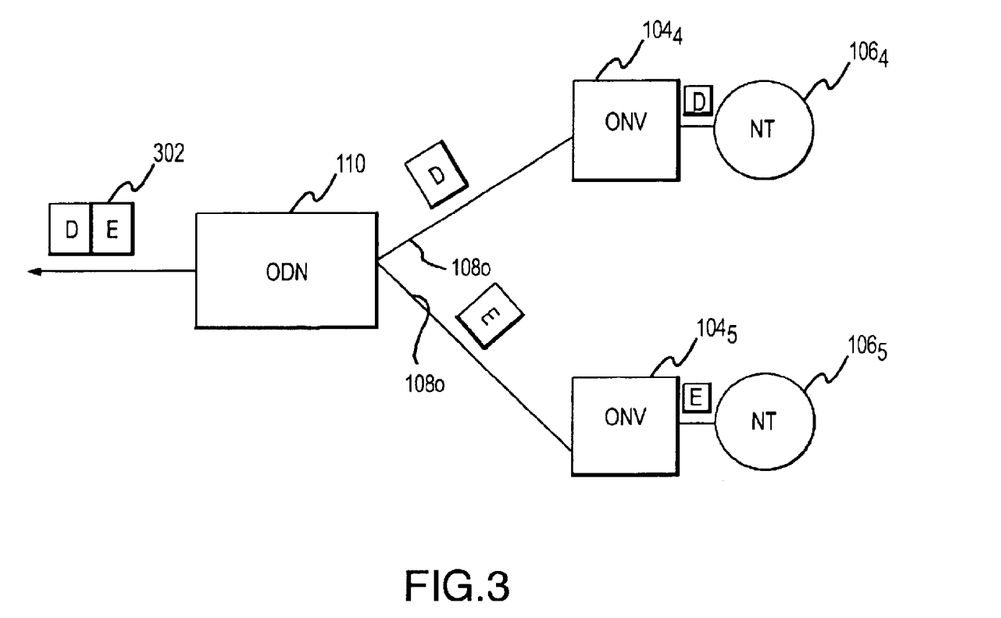
FIG. 3 is a functional block-diagram of a conventional passive optical network transmitting information from the network terminations to the transport network.

FIG. 3 shows the transmission of outgoing information from two NTs 1064 and 1065, for example. NT 106$_4$ transmits an outgoing data cell D and NT 106$_5$ transmits an outgoing data cell E over connection 108e to ONUs 104$_4$ and 104$_5$. The ONUs 104$_4$ and 104$_5$ converts the electrical signal to an optical signal for transmission to ODN 110 over connection 108o. ODN 110 combines the data cells D and E into a single cell stream 302. To prevent data collisions, APON protocols require ONUs 104 to transmit data cells at specific times and in short bursts. Thus, the laser diode (not specifically shown) associated with ONU 104 typically transmits a cell lasting a fraction of a microsecond or a burst of cells lasting a few microseconds, but may only transmit infrequently. Also, the laser diode typically transmits regularly, but may be powered down for an indeterminate length of time, which may change the laser diode's operating characteristics including the laser diode's operating temperature. Because the subscriber side laser diode may only transmit data infrequently and when it does transmit data the transmission is only a short burst of information, it is difficult to control the laser power input and light intensity.

As can be seen from the above, it would be beneficial to provide improved methods and apparatuses for measuring and controlling the power and intensity of the laser diode associated with the passive optical networks.

SUMMARY OF THE INVENTION

The foregoing and other features, utilities and advantages of the invention will be apparent from the following more particular description of a preferred embodiment of the invention as illustrated in the accompanying drawings.

To attain the advantages and in accordance with the purpose of the invention, as embodied and broadly described herein, methods to drive a laser in a passive optical network are provided. In particular, the laser is driven at a current sufficient to drive the laser to a predetermined light intensity. The current for the predetermined light intensity is measured and the current necessary to drive the laser at zero intensity is extrapolated.

The present invention further provides methods for pre-driving the laser prior to a transmission grant. The pre-drive method comprises storing a logic 0 drive current and supplying a pre-drive current to the laser.

BRIEF DESCRIPTION OF THE DRAWINGS

The accompanying drawings, which are incorporated in and constitute a part of this specification, illustrate some preferred embodiments of the invention and, together with the description, explain the goals, advantages and principles of the invention. In the drawings.

DETAILED DESCRIPTION

With reference to FIGS. 1–11, the present invention will be described. It is intended that all matter contained in the description below or shown in the accompanying drawings shall be interpreted as illustrative and not in a limiting sense.

Figure 4:
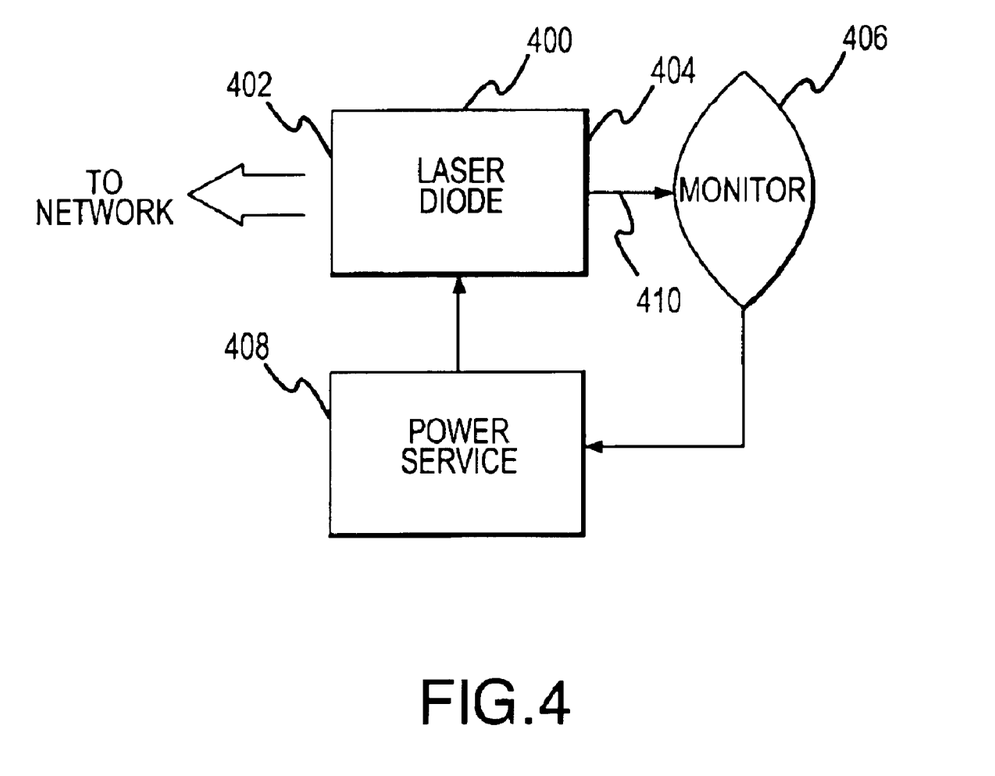
FIG. 4 is a functional block diagram of a laser diode power control feedback loop in accordance with one aspect of the present invention.

FIG. 4 shows a laser diode 400 illustrative of the present invention. While laser diodes are the typical lasing device for passive optical networks, other lasing devices could be used. Laser diode 400 includes a first lasing side 402 and a second side 404. First lasing side 402 emits light to the passive optical network (not shown in FIG. 4) while second lasing side 404 emits light to an intensity monitor 406, such as a photodiode or the like. Intensity monitor 406 sends a feedback signal to control a power source 408 that drives the laser diode 400. Thus, for example, when transmitting a logic 1 from laser diode 400, the laser diode 400's light intensity must be a certain intensity. Intensity monitor 406 would measure the intensity of a light beam 410. If the intensity of light beam 410 is below the logic 1 threshold, then the power source increases the power input to laser diode 400. Increasing the power input to laser diode 400 increases the intensity of light beam 410. Similarly, if the intensity is too high, the power is decreased. A logic 0 transmission would be controlled in a similar fashion.

The power source typically uses analog components, such as a bi-stable analog switch, to provide power to the laser. The analog components control power to the laser diode, which in turn controls the light intensity out of the laser. The analog power source, as referenced above, is a conventional device and will not be further explained.

The power necessary to drive the laser so that the light intensity is the correct level, however, is a function of wide device-to-device characteristics, the laser's aging characteristics, and the laser's operating temperature. Further, if the laser is inadvertently overpowered, the laser can be damaged. Thus, most current systems waste the initial portion of the lasing period in order to ramp the light intensity up to the desired level. Further, the analog power source design is a complex solution that requires numerous, relatively expensive parts. Finally, the analog power source provides rapid transition between the logic 1 and the logic 0 states, but does not conveniently provide a means to rapidly vary each of the currents to the laser at the logic 1 or 0 currents, respectively.

Figure 5:
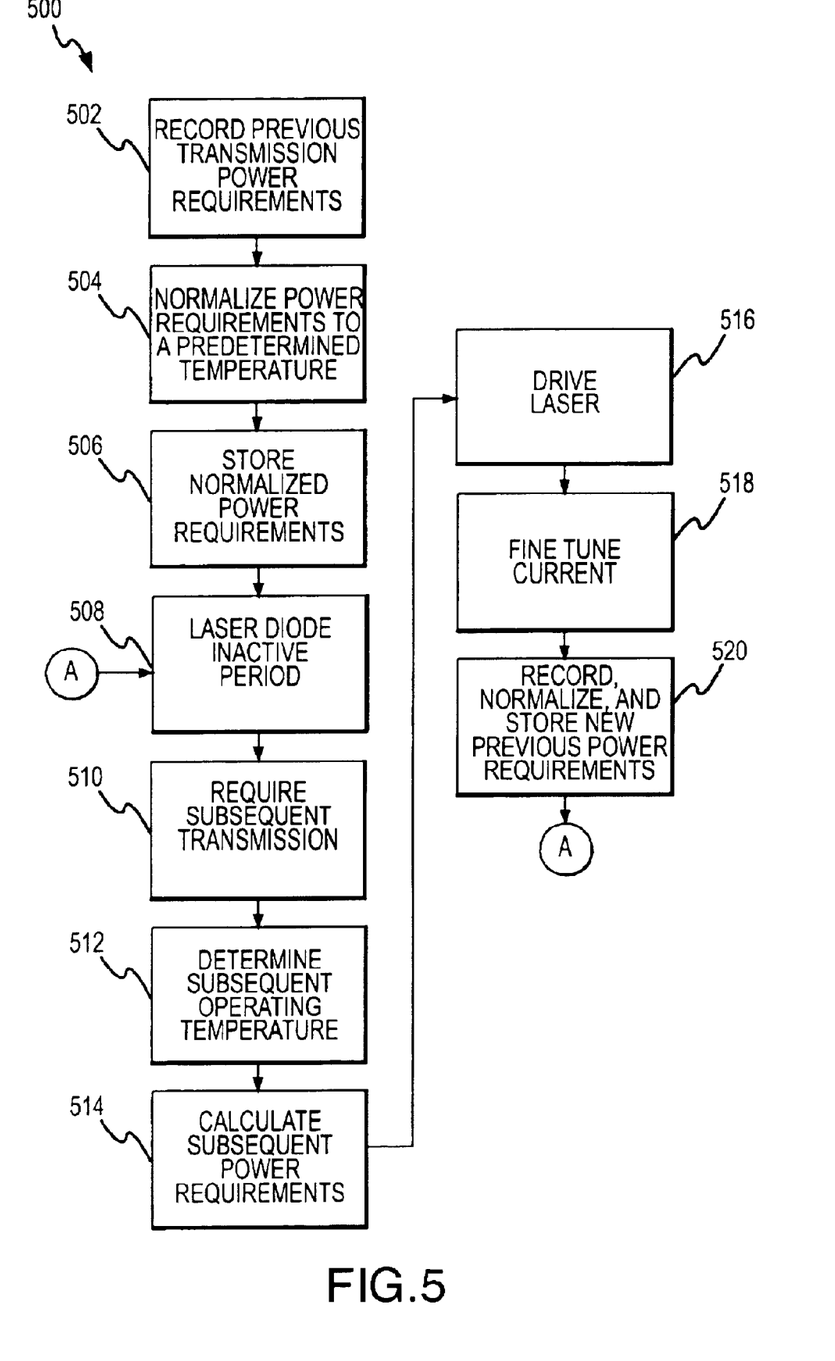
FIG. 5 is a flowchart 500 illustrative of powering a laser in accordance with one aspect of the present invention.

FIG. 5 shows a flowchart 500 indicative of a method of initially powering the laser diode 400 so that on its next transmission, the initial current supplied by power source 408 is approximately the correct power for the desired light intensity. First, during a previous transmission of signal from laser diode 400, the previous transmission of power requirements for a logic 0 signal and a logic 1 signal are recorded, step 502. While the previous transmission power requirements can be stored as analog data, if the analog data is converted to digital data, the information can be maintained for a longer duration, which may become important depending on the time delay between the previous and subsequent data transmissions. The previous transmission power requirements are then normalized to a predetermined temperature, such as 25° C., step 504. The normalized power requirement to generate a light intensity for logic 0 and the power requirement to generate a light intensity for logic 1 are stored, step 506. Notice, if the previous transmission power requirements are not normalized, the pervious transmission actual temperature could be stored, as will be explained further below. Next, the laser diode is inactive for an indefinite period of time, which could be several microseconds, seconds, minutes, hours, days, weeks, months, years, etc., step 508. The inactive period is generally contemplated to be a time when the laser diode is turned off, but the laser diode can be inactive for any number or reasons. Eventually, the laser diode is required to transmit a logic 0, a logic 1, or some combination of logic 0s and 1s in a subsequent transmission, step 510. At the time the subsequent transmission is required, a temperature sensor records subsequent transmission temperature, step 512. Using the subsequent transmission temperature, subsequent transmission power requirements for transmission of a logic 0 and a logic 1 are calculated from the stored normalized power requirements, step 514. As mentioned above, if the previous transmission power requirements are not normalized, the previous transmission temperature, the subsequent transmission temperature, and the previous transmission power requirements are used to calculate the subsequent transmission power requirements. The laser diode 400 is driven by the calculated subsequent transmission power requirements, step 516. Typically, the laser diode 400 is not precisely driven, so conventional feedback loops are used to fine tune the power needed to drive the laser diode to the correct intensities, step 518. Because the calculated subsequent transmission power requirements for the laser diode are sufficiently close to the actual power requirements, less time for each transmission burst is wasted adjusting the laser power to provide the correct intensity. Further, by applying approximately the correct drive power, the laser diode is less likely to be damaged by overdriving. Finally, during the subsequent transmission, new previous power requirements are recorded normalized, and stored for logic 0 and logic 1 transmissions, step 520, and the laser enters an inactive period, step 508. Current APON protocols identify at what points during transmission of a cell the power levels for logic 0 and/or logic 1 should be measured. Notice, new previous power requirements do not need to be obtained each subsequent transmission. Rather, it is possible to store power requirements on some time interval or some predetermined number of transmission, although replacing the stored power requirements each transmission would likely provide better initial power estimates for each subsequent transmission.

Direct Digital Drive

As mentioned above, conventional power sources to drive laser diode 400 utilize analog components. The analog solution components are relatively expensive and relatively numerous. In other words, as shown in FIG. 9, the digital signal from the processor 912 is supplied to analog power sources 916, 920. A control signal to the bi-stable switch 924 causes analog current to be supplied to the laser. It would be beneficial to supply the control signal from processor 912 to digital to analog ("DAC") converter (not specifically shown in FIG. 9). The DAC would use the digital control signal to supply an analog current to the laser. While a conventional DAC could be used, one of skill in the art would recognize that other converters are possible, such as ASIC silicon, customized microchips, or specialty DAC components. One of skill in the art would further recognize that programmable logic, such as field programmable gate arrays, are also possible. The below relates to the use of programmable logic, but one of skill in the art would recognize on reading the below, that multiple converters are possible.

Figure 6:
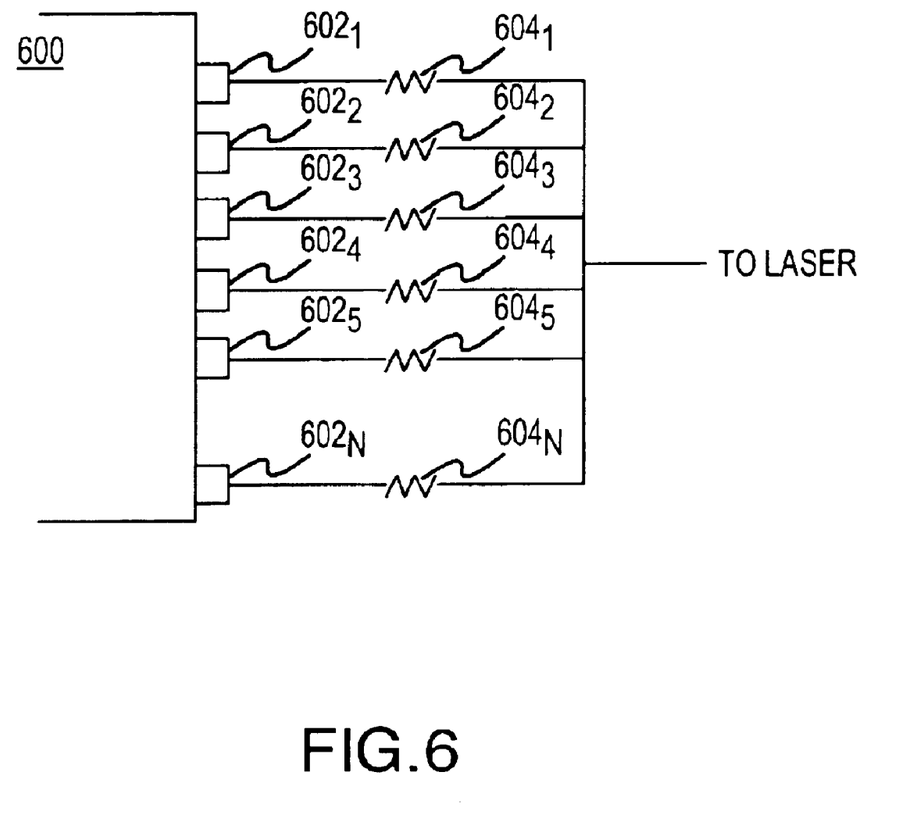
FIG. 6 is a functional block diagram of a direct digital drive for a laser in accordance with one aspect of the present invention.

Using resistors and logic for a direct digital drive requires several relatively cheap resistors and the use of part of a programmable logic part, such as an FPGA, that is conventionally available in a PON transceiver and typically has some un-used logic. FIG. 6 is a functional diagram of a digital power source 600 for the laser. Current embodiments of the digital power source 600 comprise a field programmable gate array (FPGA), but as one of ordinary skill in the art would recognize on reading this disclosure, other digital devices could be used. FPGA 600 includes a number of pins $602_{1-n}$ and a number of resistors $604_{1-m}$. Generally, each pin has a corresponding resistor. Each pin 602 of FPGA 600 is driven by a particular voltage, such as, for example, 3 volts. For pin $602_1$ to supply, for example, 1 milliamp of incremental current drive to the laser (not shown in FIG. 6), then resistor $604_1$ would be 3 K ohms. For pin $602_2$ to supply, for example, 2 milliamps of incremental current drive to the laser, then resistor $604_2$ would be 1.5 K ohms. For pin $602_3$ to supply, for example, 4 milliamps of incremental current drive to the laser, then resistor $604_3$ would be 750 ohms. For pin $602_4$ to supply, for example, 8 milliamps of incremental current drive to the laser, then resistor $604_4$ would be 375 ohms, etc. Thus, if the laser required 13 milliamps to supply a logic 1 light intensity, pins $602_1$, $602_3$, and $602_4$ would be used to drive the laser. For 10 milliamps, pins $602_2$ and $602_4$ would be used to drive the laser. As one of ordinary skill in the art would recognize on reading this disclosure, any number of combinations of output voltage and resistors could be used to provide the required combination of potential voltages. Further, while the above is shown using 1 milliamp steps smaller or larger increments could be designed for as a matter of design choice. Of course, instead of using a binary progression as shown, each pin could be capable of the same currently. For example, each pin 602 could each drive 1 milliamp. Still further, a combination of a binary progression and equally weight currents could be used. Still further, binary groupings would be possible, such as groups of 4 pins supply 1 to 15 milliamps. In other words, each group of pins has a 1 milliamp pin, a 2 milliamp pin, a 4 milliamp pin and an 8 milliamp pin. In this case, two groups would be used to supply 16 milliamps, which could all pins of 1 group and 1 milliamp from another, or 2 8 milliamp pins, etc. To provide, for example, up to 50 milliamps, four groups of pins would be provided. Of course, other combinations could be used as a matter of design choice and availability. For even greater control, adding pulse width modulation and filtering capacitance on one or more pins to maintain a relatively consistent DC output for one or more pins provides further precision control of the current drive. The additional precision is achieved, in part, because the pin's DC output could be controlled between essentially zero milliamps and the maximum milliamps.

Referring back to FIG. 9 and FIG. 6, laser diode 902 and light monitor 910 supply a feedback signal to laser power controller 912. Laser power controller 912 supplies a control signal that turns on specific pins of direct digital driver 600 to supply current to the laser diode. Notice, laser power controller 912 could be incorporated into the digital driver 600 by, for example, using programmable logic of a FPGA.

Controlling Intensity and Power

Using the FPGA and digitally driving the laser, it is possible to vary the current driving the laser instantaneously on a bit by bit basis. Thereby imparting a novel flexibility in driving the laser. For example, APON protocols dictate that the logic 0 light intensity be 0. Controlling the laser at 0 intensity also prevents light from a non-transmitting ONU to collide with an ONU having a grant to transmit. However, laser diodes operate in a non-linear manner at low intensity levels. For example, if the laser light intensity is 0 at 5 milliamps, then the laser light intensity is 0 at 2 milliamps, also. This makes it difficult to measure the power levels required for logic 0 light intensities, because of inefficiencies in the feedback.

Analog drives using bi-stable switches to drive the laser provide two currents. The bi-stable switch provides a first current for the logic 0intensity, and a second current for the logic 1 intensity. The bi-stable switches rapidly switch the drive current between the 0 level drive and the 1 level drive. However, the analog switch is relatively inflexible. In other words, it is difficulty to change the supplied current at either the 0 or 1 level. Using the direct digital drive, however, it is possible to instantaneously alter the laser's drive current. The variation is not only between the 0 and 1 level, but variations between 0 and 1, such as, for example, 2% intensity, 5% intensity, 75% intensity, or any current between 0 and maximum drive. For example, when attempting to measure the non-linear 0 intensity point, it is possible to drive the laser at a level slightly above 0 intensity level, such as, for example using 15% light intensity. Using the drive current level corresponding to light intensity just above 0, it is possible to extrapolate the correct drive current for zero intensity, or a particular below zero intensity current.

Figure 7:
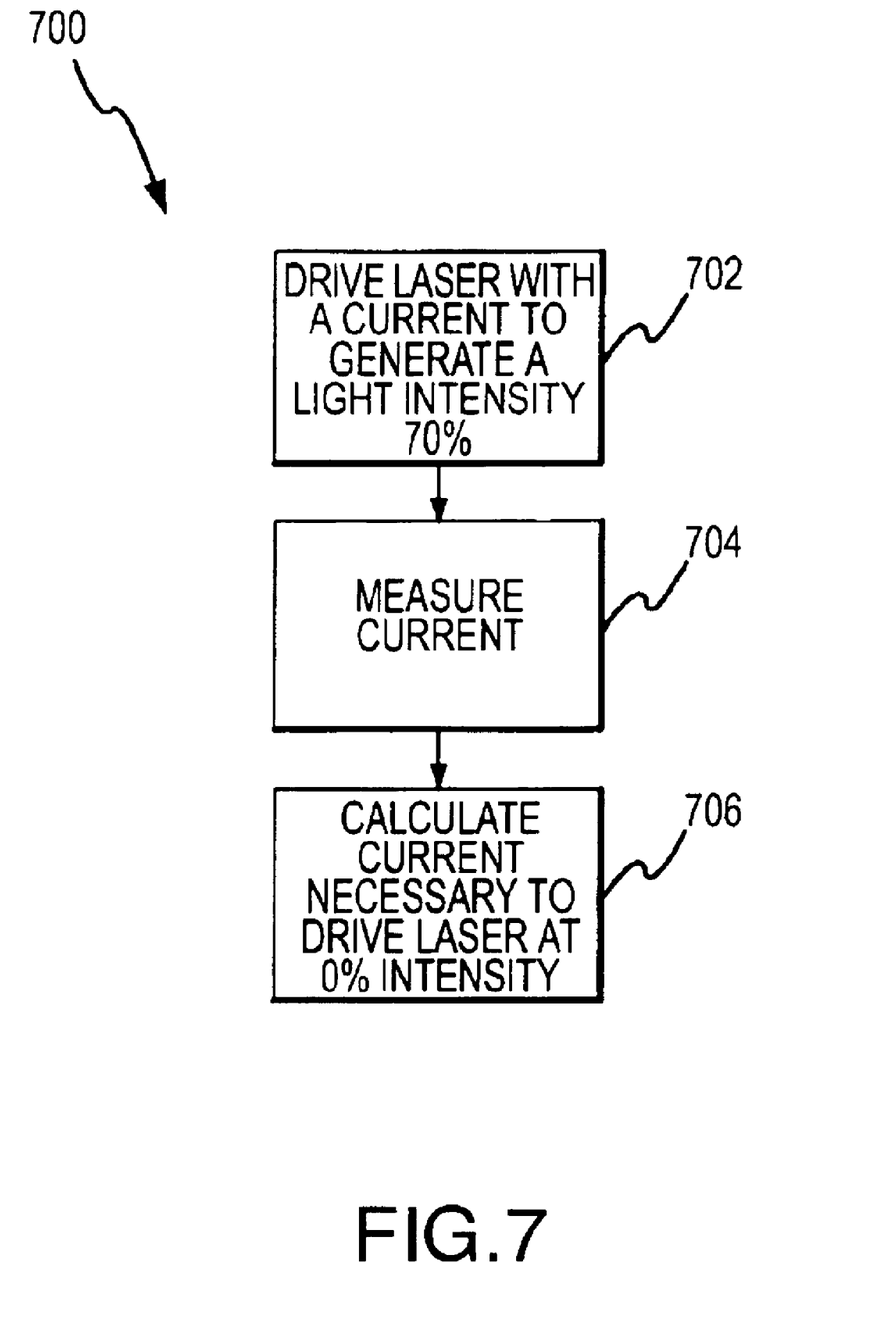
FIG. 7 is a flowchart 700 illustrative of controlling a laser drive in accordance with one aspect of the present invention.

FIG. 7 shows a flowchart 700 exemplary of this procedure. First, during the period when the logic 0 light intensity power requirements are measured, the laser would be supplied sufficient power to drive it at 15% intensity, step 702. The power requirement would be measured, step 704. Using the power required to drive the laser at 15%, the power requirement for 0% intensity would be calculated, step 706. The calculated current would be the current used to subsequently drive the laser to a zero level.

Another benefit of the unique controller it can "under drive" the laser. To under drive the laser means supplying power to the laser slightly below its 0 threshold level. For example, if the 5 milliamp current drives the laser at a 0% intensity light, under driving the laser may be done by supplying 4 milliamps or at least some current less than 5 milliamps. By under driving the laser, the laser could be turned on at a level below its 0 level by a predetermined amount. Turning the laser on below the 0 level essentially eliminates any risk of accidentally emitting light from the laser. Thus, the laser could be under driven prior to its designated transmission time. By under driving the laser, the laser has at least partially charged the photons in the lasing cavity. Thus, less time will be required to actually increase the photon density the remaining amount to the lasing threshold density and actually turn on the laser.

Figure 11:
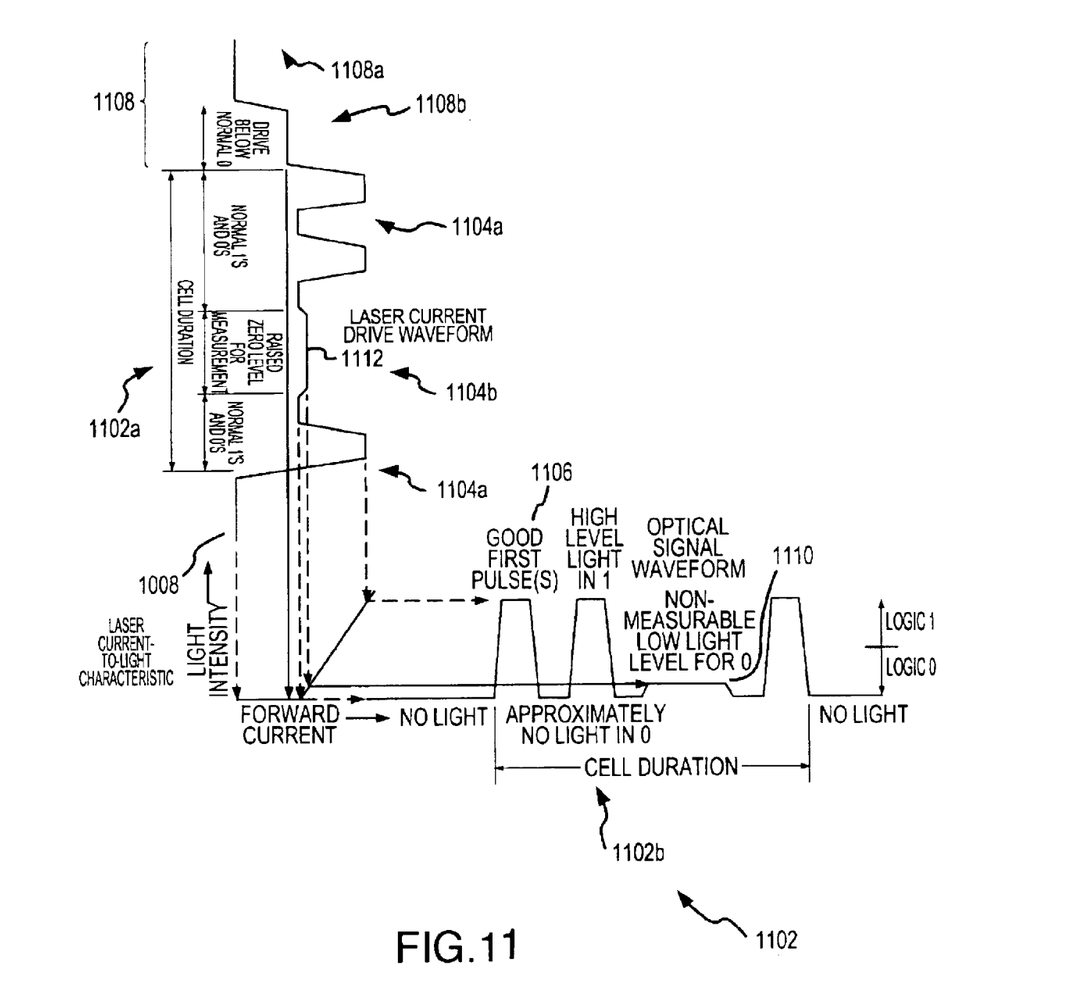
FIG. 11 is a graphical representation of laser current to light characteristics consistent illustrative of aspects of the present invention.

FIG. 11 is a diagrammatic representation of useful light intensity to drive current showing the above described control scheme. Similar to FIG. 10, FIG. 11 represents the transmission of an exemplary cell of information 1102. Cell 1102a represents drive current for exemplary cell 1102 and cell 1102b represents light intensity for exemplary cell 1102. As shown, cell 1102a can be considered in discrete parts 1104a and 1104b. Part 1104a is the drive current necessary for the transmission of light having an intensity of logic 1s and 0s for the transmission of cell information. Part 1104b is the drive current for the transmission of light having an intensity of logic 0 to allow for a zero level measurement. (A similar period exists for monitoring the logic 1 level, not shown). The duration and timing of part 1104b is generally controlled by the associated transmission protocols. Similarly, light intensity shown by cell 1102b over the course of cell 1102 transitions between the high and low drive currents for the laser diode.

As shown in FIG. 11, non-transmission period 1108 has two parts also, part 1108a is a period when no current is supplied to the laser. Part 1108b is a pre-drive period. In the pre-drive period, the digital drive is calibrated to supply a current sufficiently below the 0 logic level current. This allows the photons in the lasing cavity to be partially charged prior to when the laser receives the grant to transmit the cell 1102. Because the laser can be pre-charged for a predetermined time prior to receiving the transmission grant, the first light pulse of data 1106 can be used. In contrast, prior art power sources required at least the first pulse 1006 to be wasted because the laser had to ramp up to operating conditions.

Further, as mentioned above, measuring the current necessary to drive the laser at a 0% light intensity is difficult due to the non-linear nature of lasers below the 0% threshold. Thus, using the digital drive it is possible during part 1104b of the cell transmission to measure the current needed to drive the laser at, for example, 15% intensity. This light intensity during part 1104b of the cell transmission is shown by part 1110. Notice while 15% is stated, other percentages could be used, such as 2% light intensity, 5% light intensity 50% light intensity, 78% light intensity, etc. It is possible to measure the drive current 1112 used to produce light intensity 1110 and then calculate the drive current that would be necessary to drive the laser at only just a 0% light intensity. The calculated drive current would be used to send logic 0 signals and to pre-drive the laser at some predetermined current below the logic 0 current.

Implementation of Functionality in FPGA

Figure 8:
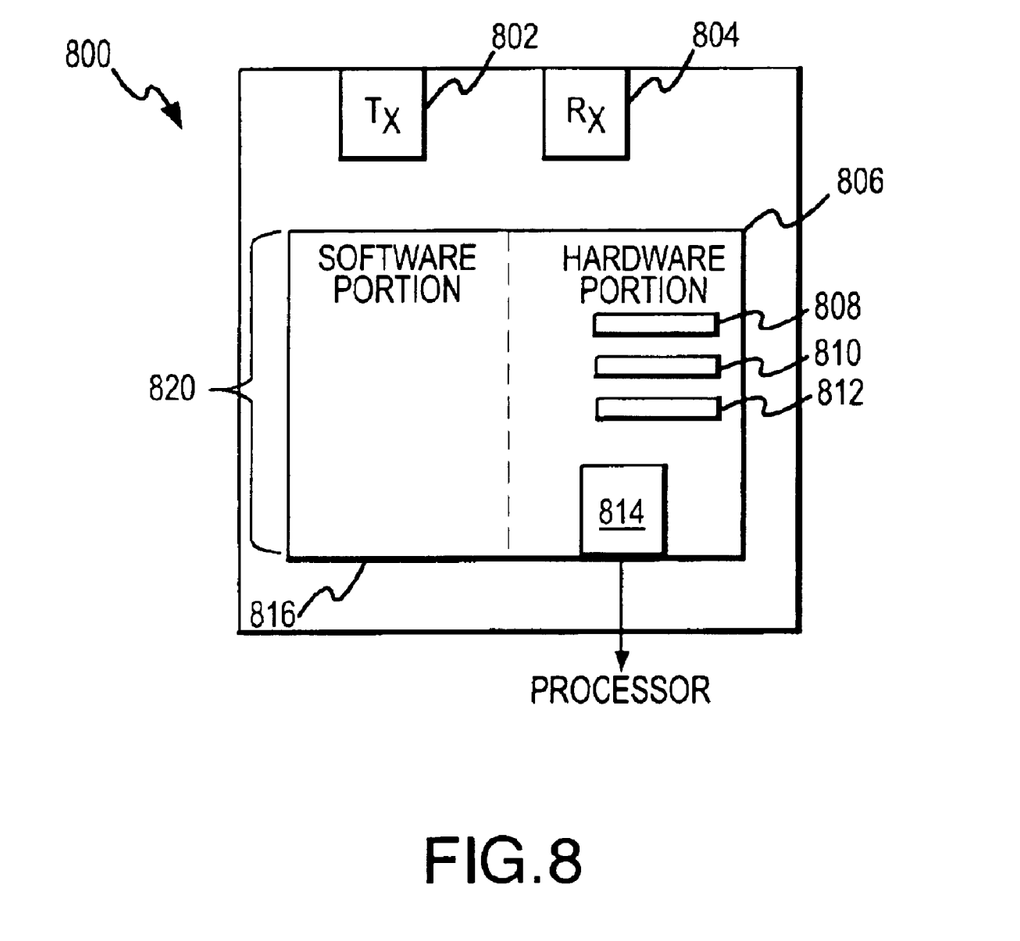
FIG. 8 is a functional block diagram of an ONU in accordance with one aspect of the present invention.

Referring to FIG. 8, section 8 of the G.983.1 standard indicates several functionalities for ONU transceivers 800. FIG. 8 shows a conventional ONU transceiver 800. Transceiver 800 includes a transmission portion 802 and a receiving portion 804 to send and receive optical signals. Transceiver 800 typically contains a hardware portion 806, such as conventional synchronization circuitry 808, switching circuitry 810, signaling circuitry 812, and a user interface circuitry 814 and a software portion 816. Traditionally, a microprocessor is used to implement software-based controls of the G.983.1 standard, such as data verification and security, such as churning. It has been discovered, however, that significant advantages are obtained when the microprocessor based software controls are replaced with field programmable logic 820, a.k.a. a FPGA. Any conventional method can be used to program the programmable logic of the FPGA to perform the functions conventionally performed by the microprocessor-based software. As shown, the FPGA 820 can be a single chip that encompasses the both the conventional hardware (circuits 806, 808, 810 and 812) as well as the conventional software portion 816 normally executed by a microprocessor.

Using the FPGA to provide the software functionality provides several advantages. First, using the FPGA logic allows a single chip (the FPGA chip) to control the PON operation. Using one chip to control the PON reduces costs, power consumption, space, etc. Further, using one chip provides increased reliability.

Using the FPGA also avoids typical parallel efforts between hardware and software development engineering groups (with their well known communication delays, and difficulties with integrating and testing two disparate design parts). Moreover, updates to the hardware and software can be provided in one combined image. Image is a term for an array of data bytes used to program a device, such as a FPGA. Often software is updated in the field by downloading an image, in this case from OLT 102 to ONU 104. ONU 104 would then use the new image to update itself, without, of course, replacing its memory. Occasionally programmable hardware is updated with a new image in the above fashion. The new hardware often needs software to recognize the new hardware. By using a single FPGA to do both the hardware and software functions, the software and hardware updates can be transmitted using a single image.

Using programmable hardware also provides unique operational advantages. In particular, performing multiple tasks in a microprocessor based software is, in reality, performing a little piece of each task in serial, choosing suitably small pieces to give the illusion that they are happening simultaneously. Implementing the software in the FPGA, however, allows parallel operation using separate logic for each function. Using separate logic paths can be faster. Further, parallel processing in the FPGA has a higher reliability than parallel processing in a software environment. Generally, the FPGA has a lower probability of getting hung up. In other words, because the functions are performed on separate logic paths, there is less chance of one process holding up another, although both still only do one little piece of one thing at a time and if the sequence gets lost the whole machine needs restarting. With separate entities if one gets lost the other processes carry on unaffected, and there is a good chance the lost process will get sorted out again.

Finally, a hardware implementation in CMOS generally uses less power then an equivalent function implemented in a microprocessor based software. The FPGA requires less power because the same functionality can be programmed using fewer gates. Also, gates can be toggled as required, thus less gate charge is moving. Less gate charge means less current and energy. For example, a 16 bit counter in hardware where 16 logic flip-flops hold 16 bits of data in place. They each are toggled only as required to make the count. A general-purpose processor, however, may store 16 bits of data in a 32-bit memory until required. The 32 bits (many of which are unused in this example, then are routed out of memory, through the general purpose logic and back to memory to achieve the same function.

While the invention has been particularly shown and described with reference to a preferred embodiment thereof, it will be understood by those skilled in the art that various other changes in the form and details may be made without departing from the spirit and scope of the invention.

I claim:

1. A method of driving a laser in a passive optical network to determine a laser drive current corresponding to a logic 0 light intensity, the method comprising the steps of:
   supplying a laser drive current sufficient to drive the laser at a predetermined light intensity greater than the logic 0 light intensity during a zero level measurement interval;
   measuring the supplied laser drive current;
   using an extrapolation technique to calculate from the measured laser drive current a 0 laser drive current, the calculated 0 laser drive current being sufficient to drive the laser to the logic 0 light intensity; and
   using the calculated 0 laser drive current to drive the laser during transmission of data corresponding to a logic 0.

2. The method according to claim 1, wherein the predetermined light intensity is less than 15% light intensity.

3. The method according to claim 1, wherein the predetermined light intensity is less than 20% light intensity.

4. The method according to claim 1, wherein the predetermined light intensity is less than 75% light intensity.

5. The method according to claim 1, wherein the predetermined light intensity is 100% light intensity or less.

6. The method according to claim 1, further comprising the step of:
   measuring a light intensity of the laser;
   generating a control signal based on the measured light intensity of the laser; and
   regulating the supplied laser drive current based on the control signal to maintain the laser at the predetermined light intensity.

7. The method according to claim 1, further comprising the step of:
   pre-driving the laser with a calculated pre-drive laser current in order to pre-drive the laser prior to receiving a transmission grant;
   the pre-drive laser current being less than the calculated 0 laser drive current and greater than 0 current.

8. The method according to claim 7, wherein the laser is pre-driven a predetermined amount of time prior to receiving the transmission grant.

9. The method according to claim 7, wherein the laser is pre-driven except during the transmission grant.

10. A laser drive, comprising:
    a current source connected to supply current to the laser;
    a current measuring device connected to the current source generating a current level signal based on the magnitude of the current supplied to the laser from the current source;
    a processor connected to the current measuring device to receive the current level signal; and
    a memory connected to the processor to receive and store the current level signal, wherein;
    the current source supplies a laser drive current that is greater than a 0 drive current in order to drive the laser at a predetermined light intensity during a zero level measurement interval, the current measuring device measures the laser drive current supplied during the zero measurement interval and transmits a current level signal to the processor for storage in the memory during the zero level measurement interval, the processor uses an extrapolation technique to calculate a 0 laser drive current based on the current level signal stored in the memory during the zero level measurement interval, the processor stores the calculated 0 laser drive current in memory, such that during transmission of data corresponding to a logic 0, the current source supplies the laser with the calculated 0 laser drive current stored in memory.

11. The laser drive according to claim 10, wherein the current source comprises at least one of a DAC, a ASIC silicon, a microchip, and programmable logic.

12. The laser drive according to claim 10, wherein the current source is a field programmable gate array.

13. The laser drive according to claim 10, wherein the predetermined light intensity is less than 15%.

14. The laser drive according to claim 10, wherein the predetermined light intensity is less than 50%.

15. The laser drive according to claim 10, wherein the current source supplies a pre-drive current to the laser in order to pre-charge the laser prior to receiving a transmission grant;

the pre-drive current being less than the calculated 0 laser drive current stored in the memory.

16. The laser drive according to claim 10, including:

a light intensity measuring device responsive to light intensity from the laser, the light intensity measuring device measuring the light intensity of the laser and providing a feed back signal to the processor such that the current source supplies current to the laser to maintain the predetermined light intensity.

17. The laser drive according to claim 16, wherein the light intensity measuring device is a photodiode.

18. A method of driving a laser in a passive optical network to pre-charge the laser and to drive the laser to transmit information, comprising the steps of:

providing a measurement current to the laser during a zero level measurement interval, measuring the measurement current;

using an extrapolation technique to calculate from the measurement current a logic 0 current required to drive the laser at a logic 0, the logic 0 current being less than the measurement current;

storing the calculated logic 0 current;

supplying a laser drive current sufficient to pre-drive the laser at a current less than the stored logic 0 current prior to receiving a transmission grant;

receiving a transmission grant; and using the stored logic 0 current to drive the laser to transmit information after receiving the transmission grant.

19. The method according to claim 18, wherein the supplying step comprises turning on and off output pins of a field programmable gate array that are connected to supply the laser drive current to the laser.

20. A laser drive, comprising:

current supply means connected to supply current to a laser and providing a measurement current to the laser during a zero level measurement interval to cause the laser to output a predetermined light intensity greater than 0%;

a current measuring device connected to the current supply means and generating a current level signal based on the measurement current supplied to the laser during the zero level measurement interval;

a memory;

a processor connected to the current supply means, to the current measuring device, and to the memory;

the processor receiving the current level signal from the current measuring means;

the processor using the current level signal and an extrapolation technique to calculate a 0 intensity laser drive current that corresponds to a current greater than 0 amps that drives the laser at a zero light intensity, the 0 intensity laser drive current being less than the measurement current;

the processor storing the 0 intensity laser drive current in the memory; and the processor controlling the current supply means to supply a laser drive current to the laser that is less than the stored 0 intensity laser drive current prior to the laser receiving a transmission grant.

21. The laser drive according to claim 20, wherein the current supply means comprises a field programmable gate array having a plurality of pins individually connected to one of a plurality of resistors that are connected in parallel to supply current to the laser.

* * * * *